(12) United States Patent
Chidambarrao (10) Patent No.: US 7,274,084 B2
(45) Date of Patent: Sep. 25, 2007

(54) ENHANCED PFET USING SHEAR STRESS (75) Inventor: Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,589

(22) Filed: Jan. 12, 2005

(65) Prior Publication Data
US 2006/0151838 A1    Jul. 13, 2006

(51) Int. Cl.
H01L 29/00    (2006.01)
(52) U.S. Cl. .................. 257/510; 257/E21.548
(58) Field of Classification Search .......... None
See application file for complete search history.

(56) References Cited

U.S. PATENT DOCUMENTS

| | | |
|---|---|---|
| 3,602,841 A | 8/1971 | McGroddy |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |

(Continued)

FOREIGN PATENT DOCUMENTS

EP    A 1 174 928    1/2002

(Continued)

OTHER PUBLICATIONS

T. Okagaki, M. Tanizawa, T. Uchida, T. Kunikiyo, K. Sonoda, M. Igarashi, K. Ishikawa, T. Takeda, P. Lee, G. Yokomizo, "Direct Measurement of Stress Dependent Inversion Layer Mobility Using a Novel Test Structure", 2004 Symposium on VLSI Technology, Digest of Technical Papers, pp. 120-121.

Sayama H., et al., "Effect of <100> Channel Direction for High Performance SCE Immune PMOSFET with Less than 0.15MUM Gate Length" International Electron Devices Meeting 1999. IEDM. Technical Digest. Washington DC, Dec. 5-8, 1999, New York, N: IEEE, US, Aug. 1, 2000, pp. 657-660, XP000933266 ISBN: 0-7803-5411-7.

(Continued)

Primary Examiner—Wai-Sing Louie
Assistant Examiner—Mursalin B. Hafiz
(74) Attorney, Agent, or Firm—John P. Abate, Esq.

(57) ABSTRACT

A semiconductor device structure includes a gate structure disposed on a portion of substrate, source and drain regions disposed adjacent to the portion so as to form a channel region in the portion, and trench isolation regions located immediately adjacent to the source and drain regions. At least portions of the trench isolation regions include stress materials such that the materials generate shear stresses in the channel region.

18 Claims, 8 Drawing Sheets

Embodiment 2
In this embodiment shear loading is done using compressive elements in longitudinal direction.

U.S. PATENT DOCUMENTS

| | | | |
|---|---|---|---|
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,847,419 | A | 12/1998 | Imai et al. |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,441,396 | B1 | 8/2002 | Adams et al. |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,580,154 | B2 | 6/2003 | Noble et al. |
| 6,600,170 | B1 | 7/2003 | Xiang |
| 6,621,392 | B1 | 9/2003 | Volant et al. |
| 6,635,506 | B2 | 10/2003 | Volant et al. |
| 6,642,536 | B1 | 11/2003 | Xiang et al. |
| 6,649,486 | B1 | 11/2003 | Balakumar et al. |
| 6,794,718 | B2 | 9/2004 | Nowak et al. |
| 6,825,529 | B2 * | 11/2004 | Chidambarrao et al. .... 257/336 |
| 6,828,211 | B2 | 12/2004 | Chi |
| 6,974,981 | B2 * | 12/2005 | Chidambarrao et al. .... 257/265 |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2005/0087832 | A1 * | 4/2005 | Park .......................... 257/506 |
| 2006/0246698 | A1 * | 11/2006 | Yao et al. .................. 438/591 |

FOREIGN PATENT DOCUMENTS

| | | | |
|---|---|---|---|
| JP | | 64-76755 | 3/1989 |
| WO | | WO94/27317 A | 11/1994 |
| WO | | WO 02/45156 A3 | 6/2002 |

OTHER PUBLICATIONS

Patent Abstracts of Japan vol. 0134, No. 35 (E-825), Sep. 28, 1989 & JP 1 162362 A (Fujitsu Ltd), Jun. 26, 1989.

Kern Rim, et al., "Transconductance Enhancement in Deep Submicron Strained-Si n-MOSFETs", International Electron Devices Meeting, 26, 8, 1, IEEE, Sep. 1998.

Kern Rim, et al.,"Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, J. Cressler, G. Niu, A. Joseph, "A New 'Mixed-Mode' Reliability Degradation Mechanism in Advanced Si and SiGe Bipolar Transistors". IEEE Transactions on Electron Devices, vol. 49, No. 12, Dec. 2002, pp. 2151-2156.

H.S. Momose, Y. Niitsu, H. Iwai, K. Maeguchi, "Temperature Dependence of Emitter-Base Reverse Stress Degradation and its Mechanism Analyzed by MOS Structures". Paper 6.2, pp. 140-143.

C.J. Huang, C.J. Sun, T.A. Grotjohn, D.K. Reinhard, "Temperature Dependence and Post-Stress Recovery of Hot Electron Degradation Effects in Bipolar Transistors". IEEE 1991 Bipolar Circuits and Technology Meeting 7.5, pp. 170-173.

S.R. Sheng, S.P. McAlister, J.P. McCaffrey, S. Kovacic, "Degradation and Recovery of SiGe HBTs Following Radiation and Hot-Carrier Stressing". pp. 14-15.

Z. Yang, F. Gaurin, E. Hostetter, G. Freeman, "Avalanche Current Induced Hot Carrier Degradation in 200GHz SiGe Heterojunction Bipolar Transistors", pp. 1-5.

H. Li, H.M. Rein, T. Suttorp, "Design of W-Band VCOs with High Output Power for Potential Application in 77 GHz Automotive Radar Systems". 2003 IEEE GaAs Digest, pp. 263-266.

H. Wurzer, R. Mahnkopf, H. Klose, "Annealing of Degraded npn-Transistors- Mechanisms and Modeling". IEEE Transactions on Electron Devices, vol. 41, No. 4, Apr. 1994, pp. 533-538.

B. Doyle, G.J. Dunn, "Recovery of Hot-Carrier Damage in Reoxidized Nitrided Oxide MOSFET's". IEEE Electron Device Letters, vol. 13, No. 1, Jan. 1992, pp. 38-40.

H.S. Momose, H. Iwai, "Analysis of the Temperature Dependence of Hot-Carrier-Induced Degradation in Bipolar Transistors for Bi-CMOS". IEEE Transactions on Electron Devices, vol. 41, No. 6, Jun. 1994, pp. 978-987.

H.S. Momose, Y. Niitsu, H. Iwai, K. Maeguchi, "Temperature Dependence of Emitter-Base Reverse Stress Degradation and its Mechanism Analyzed by MOS Structures". Paper 6.2, pp. 140-143, 1989.

S.R. Sheng, S.P. McAlister, J.P. McCaffrey, S. Kovacic, "Degradation and Recovery of SiGe HBTs Following Radiation and Hot-Carrier Stressing". pp. 14-15, 2003.

* cited by examiner

FIG. 1 (PRIOR ART)

Embodiment 4
In thie embodiment shear loading is done using tensile elements in the transverse direction.

Embodiments 1 & 2 Process (1) Using standard processing steps known in prior art process wafer through STI steps with, e.g., a nitride cap above the active area still in place.

(2) Strip the nitride cap with the pad oxide in place.

(3) Use standard lithographic processes with a block mask and suitably etch the STI regions in the cross-hatched regions R indicated in Figure 2-3.

(4) Strip the photoresist.

(5) Deposit highly compressive material (such as compressive PECVD nitride) to such a thickness that the material fills the regions R. Preferably, the material extends approximately 10% to 30% along one side of each of the source and drain regions shown in Figures. This step imposes counter-clockwise (negative) shear on the structure, particularly on, e.g., SOI where the active area is supported on a BOX.

(6) Follow up with standard Chemical Mechanical Polish (CMP) planarization and follow through with standard processing.

FIG 6

Embodiments 3 & 4 Process
---

(1) Using standard processing known in prior art process wafer through STI with nitride cap above the active area still in place.

(2) Strip the nitride cap with the pad oxide still in place.

(3) Use standard lithographic processes with a block mask and etch the STI region in cross-hatched regions R indicated in Figure 4-5.

(4) Strip the photoresist.

(5) Deposit highly tensile material (such as tensile PECVD nitride) to such a thickness that the material fills the regions R. Preferably, the material extends approximately 10% to 30% along one side of each of the source and drain regions shown in Figures. This step imposes counter-clockwise (negative) shear on the structure, particularly on SOI where the active area is supported on a BOX.

(6) Follow up with standard Chemical Mechanical Polish (CMP) planarization and follow through with standard processing.

ENHANCED PFET USING SHEAR STRESS

FIELD OF THE INVENTION

The present invention relates to semiconductor devices such as field effect transistors and, more particularly, to structures which include such devices and stress materials to enhance charge carrier mobility.

BACKGROUND OF THE INVENTION

Figure 1:
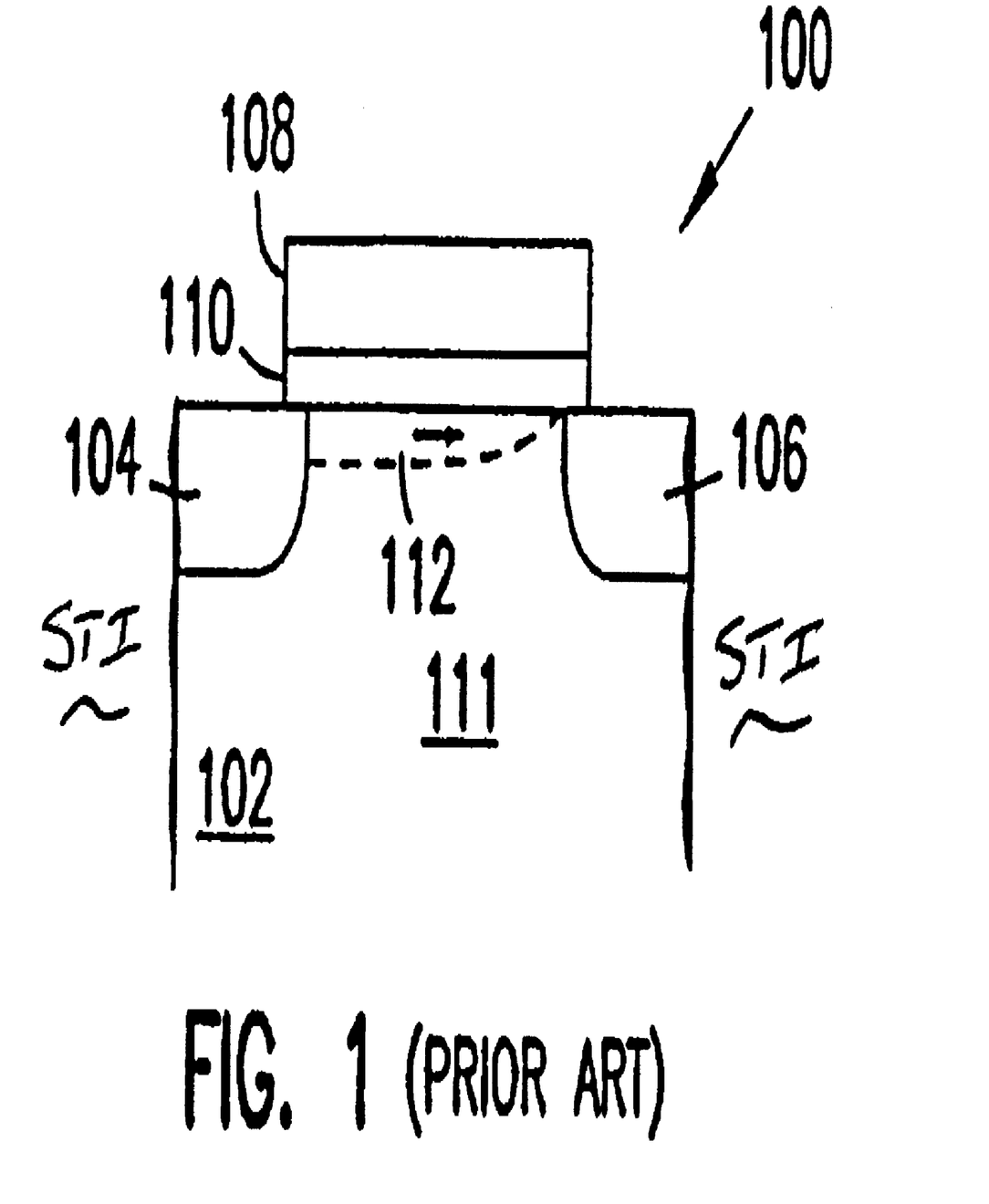
FIG. 1 is a side schematic view of a prior art semiconductor device.

FIG. 1 shows a known semiconductor device such as an NFET or PFET isolated by shallow trench isolation regions (STI) to form a structure 100. The structure 100 includes a semiconductor (e.g., silicon) substrate or wafer 102, a source region 104, a drain region, 106, a gate 108, an oxide layer 110, a body region 111, and a channel region 12 between the source region 104 and the drain region 106. As is well-known in the art, a voltage differential between the source region 104 and the drain region 106 induces an electric field across the channel region 112. A gate potential applied to the gate 108 can create an inversion layer in the body region 111 allowing the channel region 112 to form between the source region 104 and the drain region 106. This electric field is expressed in terms of the voltage differential between the source region 104 and the drain region 106 per the length of the channel region 112.

The structure 100 typically also includes isolation regions STI in order to isolate electrically each semiconductor device from other semiconductor devices. A plurality of isolation regions STI are formed in the semiconductor substrate 102 in order to isolate electrically a plurality of semiconductor devices formed in the semiconductor substrate. The isolation regions illustrated in FIG. 1 are shallow trench isolation (STI) regions formed by anisotropically etching the semiconductor substrate 102 to form trenches. A thermal oxide liner layer is grown by conventional methods to a thickness of about 10 Å to about 100 Å, such as by exposing the semiconductor substrate 102 to an oxygen ambient at a temperature about 185° C. to about 1150° C. The trenches are subsequently filled with an insulating material such as silicon oxide, by a conventional CVD process to form the isolation regions STI. Some of the conventional methods of filling a trench with silicon oxide include a) tetraethylorthosilicate low pressure chemical vapor deposition (LPTEOS), b) non-surface sensitive TEOS-ozone atmospheric pressure or sub-atmospheric chemical vapor deposition (APCVD or SACVD), and c) silane oxidation high-density plasma CVD, all as well known to those skilled in the art.

It is also known that compressive stress or tensile stress materials disposed in the structure can enhance charge carrier mobility. In order to maximize the performance of both NFETs and PFETs within an integrated circuit (IC) chip which includes numerous structures 100, tensile nitride liners have been used on NFETs and compressive nitride liners have been used on PFETs. The liners applied desired stresses to the channel. See for example, Yang et al, IEDM 2004, p 978, incorporated herein, and commonly-owned U.S. patent applications: Ser. No. 10/905,025 filed Dec. 10, 2004, Ser. No. 10/905,027 filed Dec. 10, 2004, Ser. No. 10/905,024 filed Dec. 10, 2004, which are all incorporated herein in their entireties.

It is also known that piezoresistance coefficients for doped Si in the crystal orientation X=[100], Y=[010], Z=[001], are as follows (Smith, Phys. Rev. V94, 1954, beginning on p. 42):

|  | $\times 10^{-11} Pa^{-1}$ | |
| --- | --- | --- |
|  | n-Si | p-Si |
| $\Pi_{11}$ | −102 | +6.6 |
| $\Pi_{12}$ | +53.4 | −1.1 |
| $\Pi_{44}$ | −13.6 | 138.1 |

It has been shown that for PFETs in rotated wafers (with orientations X=[100], Y=[010], Z=[001]), the longitudinal and transverse stress effects are small (Okagaki, et al., VLSI, 2004, pgs. 120-121). This is because the constants $\Pi_{11}$ and $\Pi_{12}$ are small. The Smith and Okagaki references are incorporated herein in their entireties.

SUMMARY OF THE INVENTION

The present inventor observed that in order to improve the PFET mobility using stress, the primary stress can be shear stress. A positive piezoresistance coefficient needs a negative stress to obtain a mobility enhancement. Therefore, we need to apply a negative shear in the crystal orientation which affects the mobility through the $\Pi_{44}$s. The piezoresistance coefficients in both the rotated wafer orientations X=[100], Y=[010], Z=[001] and the standard wafer orientations X=(110), Y=(001), Z =(1-10) are such that the shear stress benefit occurs to optimum effect in both types of wafers.

Of all the shear stress components, the easiest that can be applied is the in-plane XZ shear component as shown below in FIG. 2 for preferred embodiment 1 of the present invention. Therefore, the desired stresses are as applied in the FIG. 2; see arrows.

Because the piezoresistance coefficient $\Pi_{44}$ is positive for the PFET, a negative shear needs to be applied. Negative shear stress is defined herein as applying a counter-clockwise torque T to an active area region of the semiconductor substrate as shown schematically in FIGS. 2, 3, 4 and 5 of the present application. In this invention, we apply the forces F that apply the shear through the use of new replacement high intrinsic stress trench materials that abut only specific parts of the source and drain regions. In general, T=r F sin $\ominus$, wherein r is an axis of rotation, F is a force applied in a plane perpendicular to axis of rotation, and $\ominus$ is the angle between directions in which vectors r and F point.

Thus, according to the present invention, a semiconductor device structure includes a gate structure disposed on a portion of substrate, source and drain regions disposed adjacent to the portion so as to form a channel region in the portion, and trench isolation regions located immediately adjacent to the source and drain regions, wherein at least portions of the trench isolation regions include stress materials such that the materials generate shear stresses in the channel region.

Preferably, the compressive materials are those with high intrinsic stresses or those which shrink substantially. Preferably, the tensile materials are, eg, Plasma Enhanced CVD (PECVD) nitride (to create intrinsic stress levels of up to about −3 GPa) and compressive HDP oxide (to create intrinsic stress levels of up to about −0.5 GPa). The portions of the isolation regions can also be filled with polysilicon that is oxidized which expands and causes compression to magnitudes of approximately (±10%)−3 GPa; however, the process complexity makes it a more difficult choice. Preferably, the materials are PECVD nitride (to create intrinsic stress levels of up to about +1.6 GPa) LPTEOS (to create intrinsic stress levels of about +0.5 GPa), spin-on-glass (to create combined intrinsic and shrinkage stress levels of about +2 GPa) or tensile HDP oxide (to create intrinsic stress levels of about 0.6 GPa).

Shear stress values of approximately 100 MPa to 700 MPa can be applied in the device channel through the use of materials with intrinsic stresses in the range of about 0.3 GPa to about 2.9 GPa.

This type of structure can also be produced on a silicon-on-insulator (SOI) substrate, or other types of semiconductor substrates (wafers).

It is a principal object of the present invention to enhance carrier mobility in an active device.

Further, and still other objects of the present invention will become more readily apparent when the following detailed description is taken in conjunction with the accompanying drawings, in which:

DETAILED DESCRIPTION OF THE PREFERRED EMBODIMENTS

Reference is now made to FIGS. 2-8.

According to various preferred embodiments of the present invention:

An in-plane piezoresistance shear coefficient for the PFET is +138.1 for both rotated and standard wafers.

Figure 2:
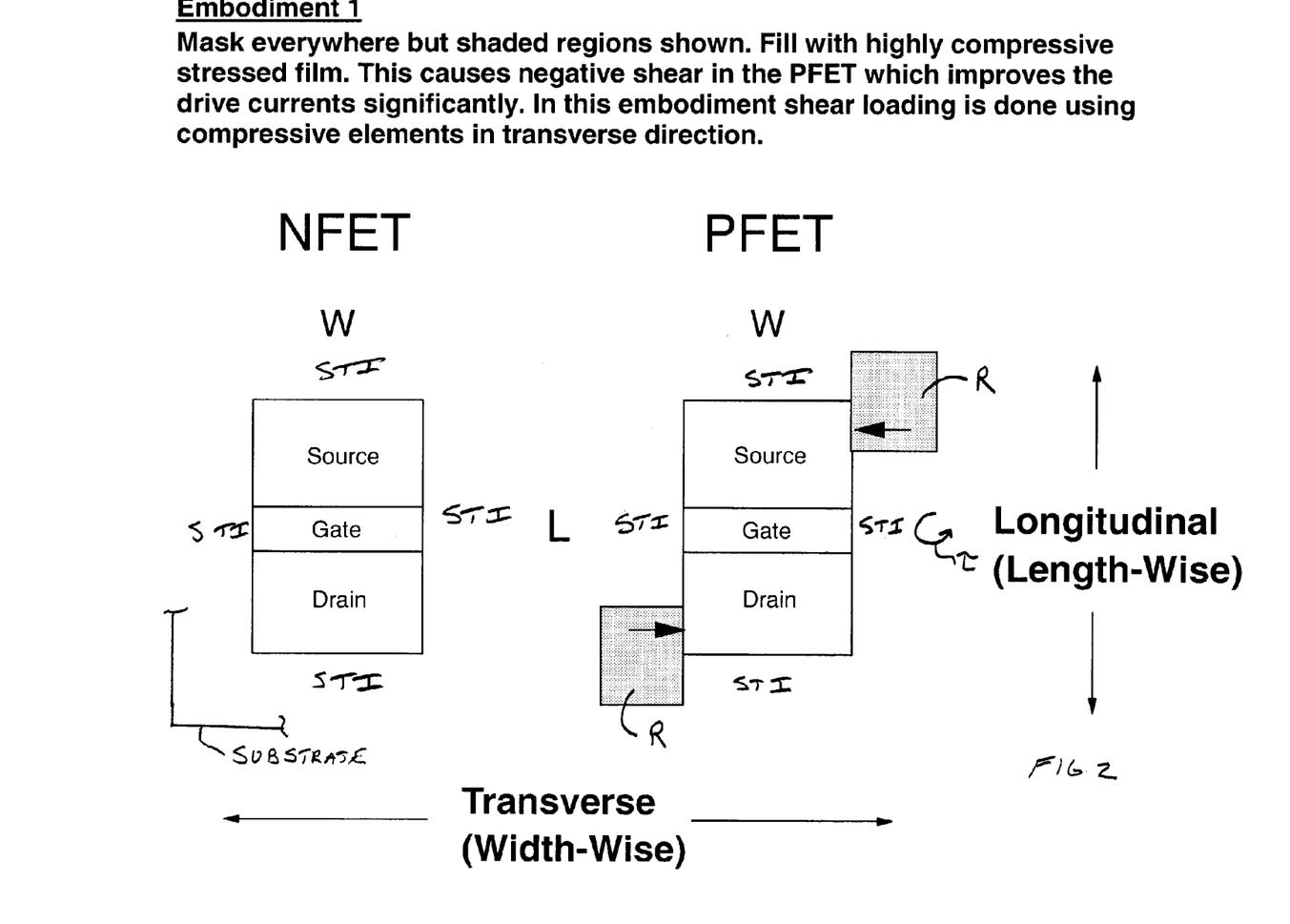
FIGS. 2-5 are top plan schematic views of various preferred embodiments according to the present invention.

Therefore, use negative shears which are shown for example in the FIG. 2.

The NFET piezoresistive shear coefficients are small in both wafer systems.

Therefore, one can do shears through STI regions, and while shears are applied on both NFET and PFET, the enhanced mobility effect according to the present invention results primarily in the PFET.

Figure 3:
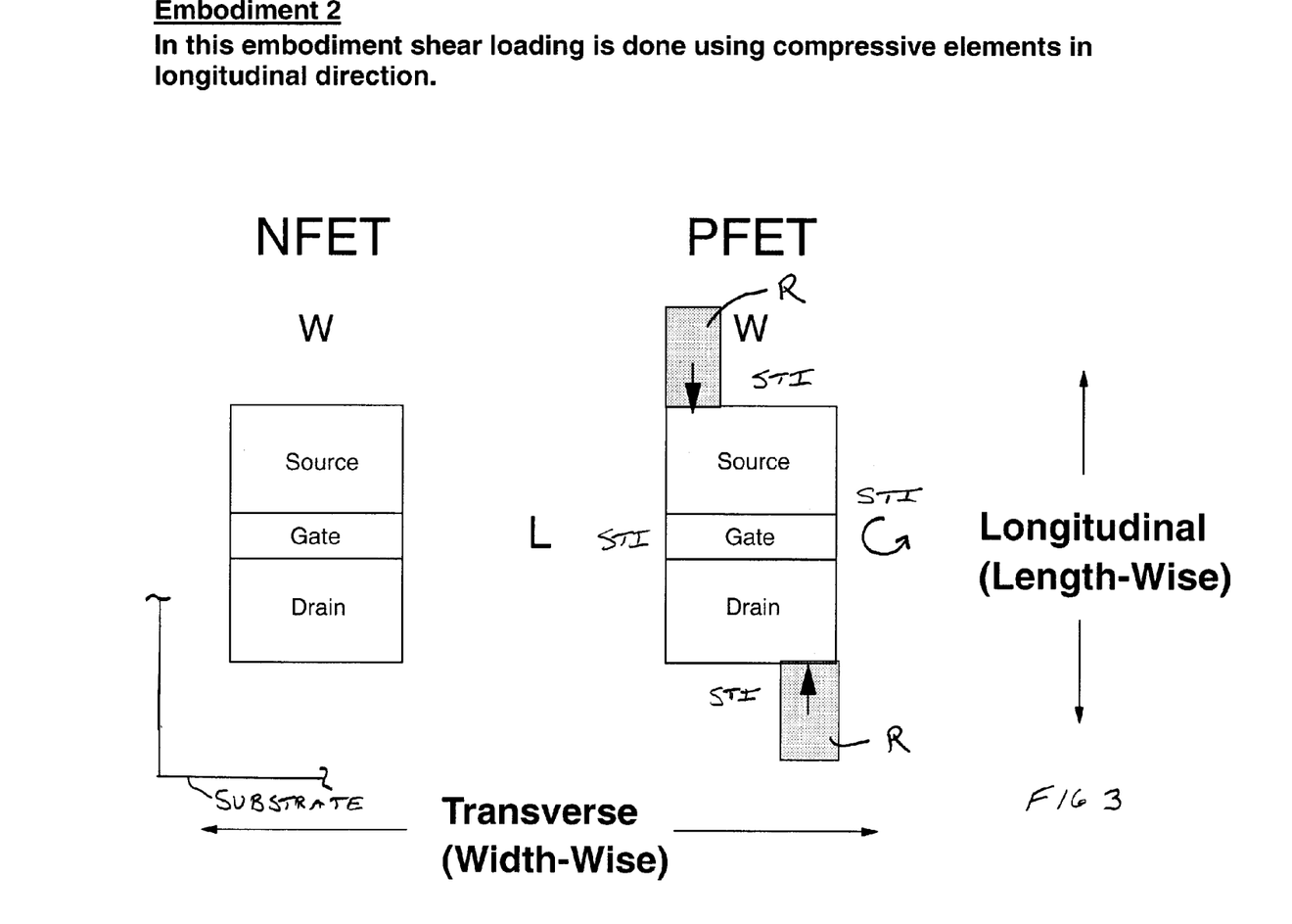

As shown in FIGS. 2, 3 compressive stress materials substantially fill portions of the STI regions.

Figure 4:
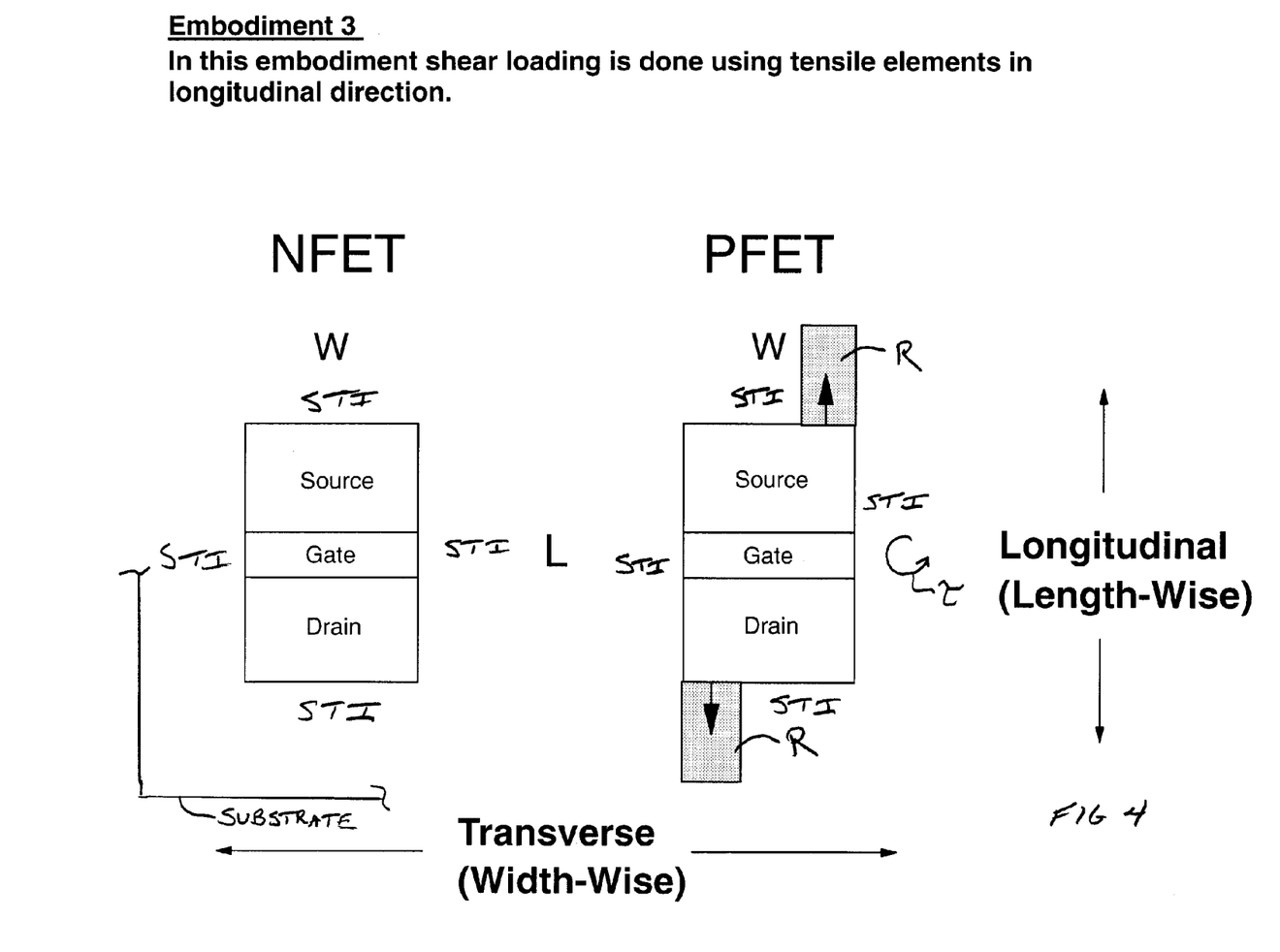
Figure 5:
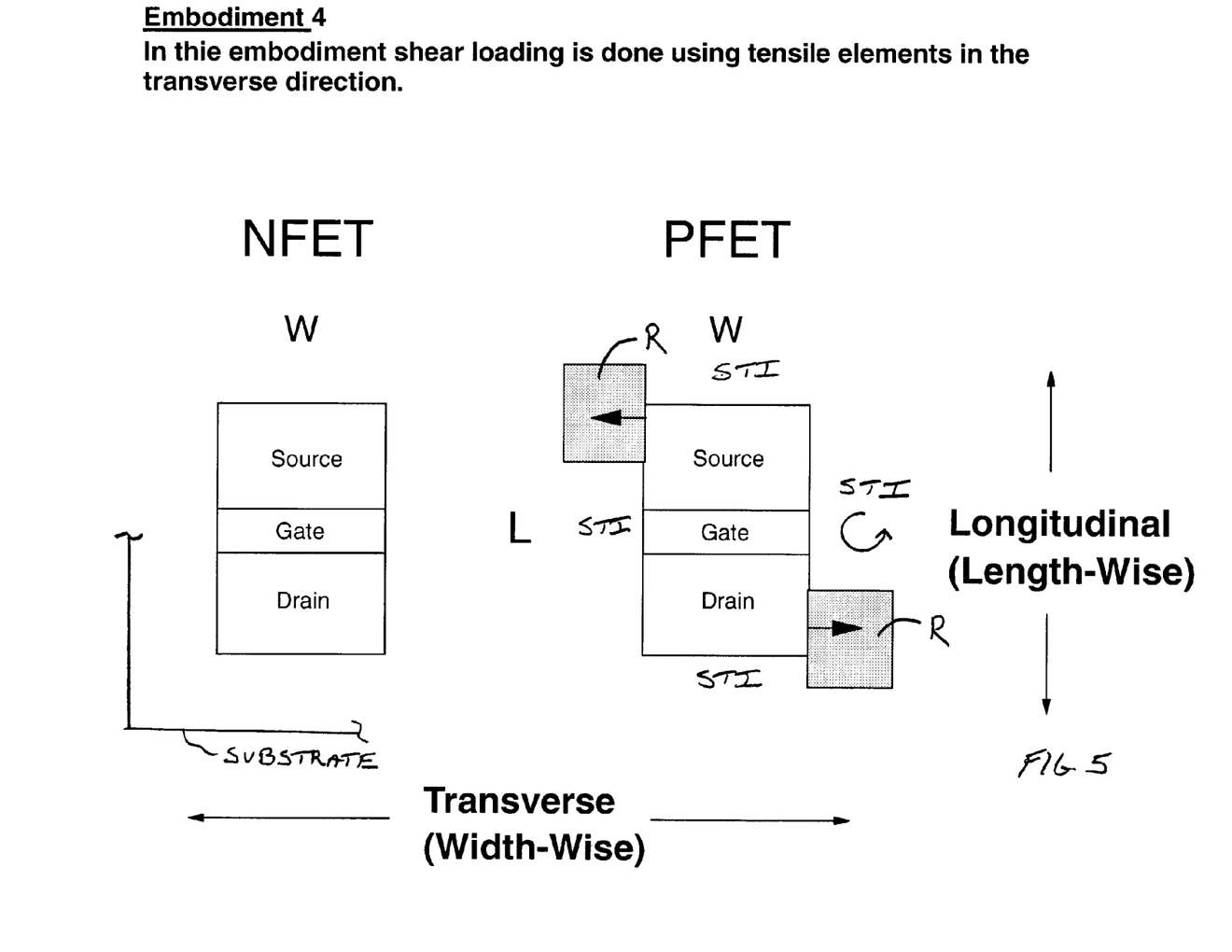
Figure 6:
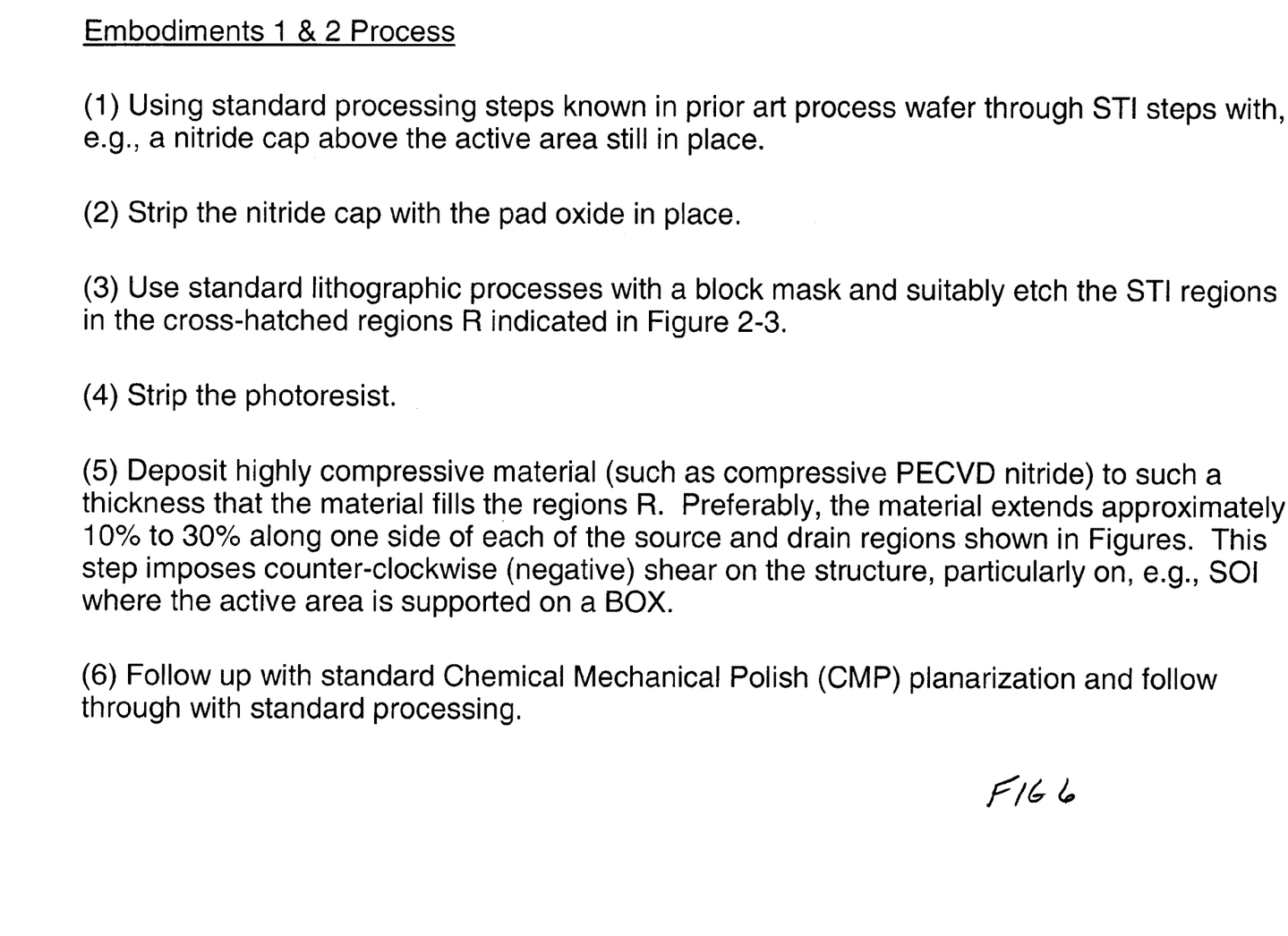
FIGS. 6, 7 are preferred flow charts for realizing the embodiments of FIGS. 2-5.
Figure 7:
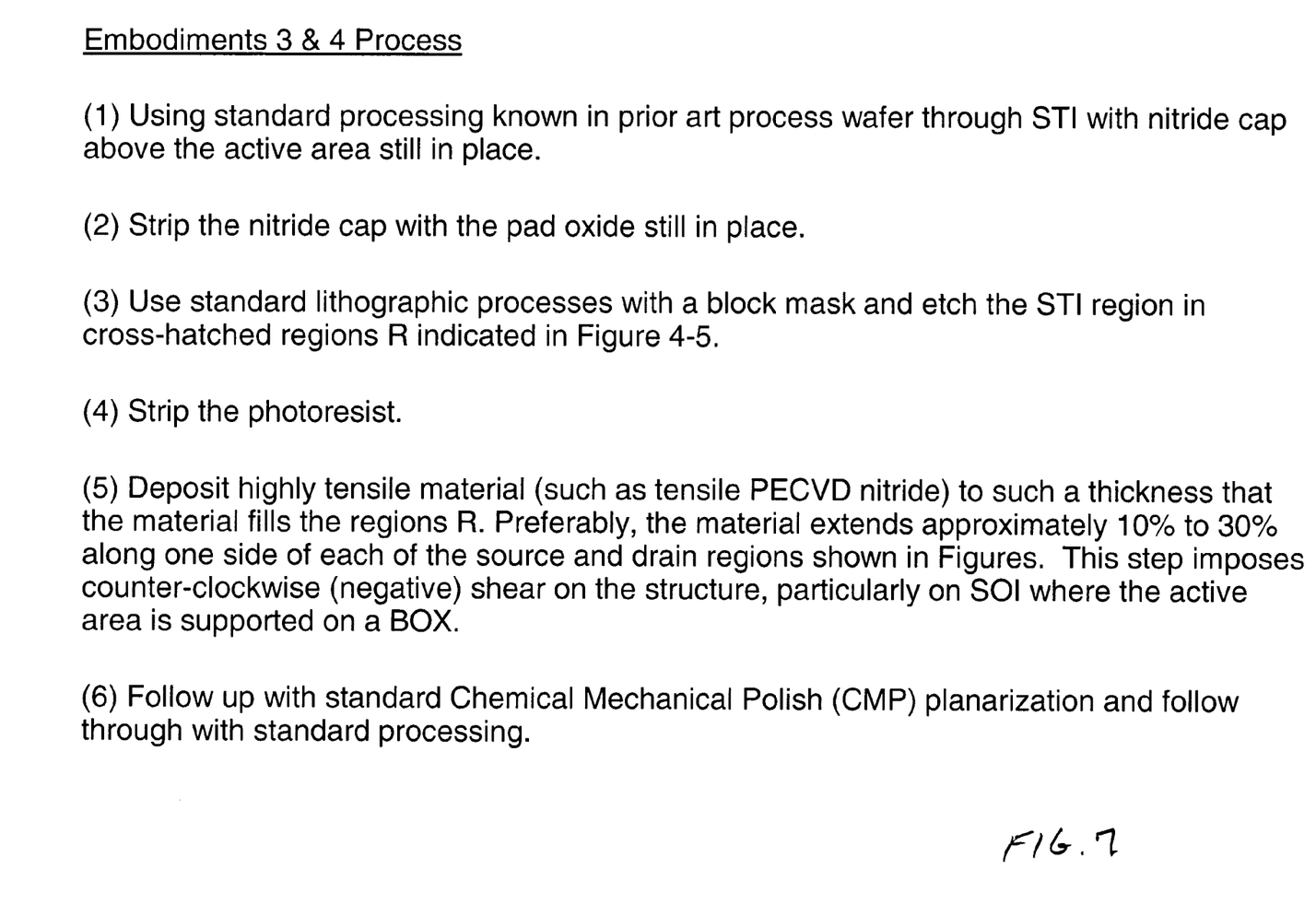
Figure 8:
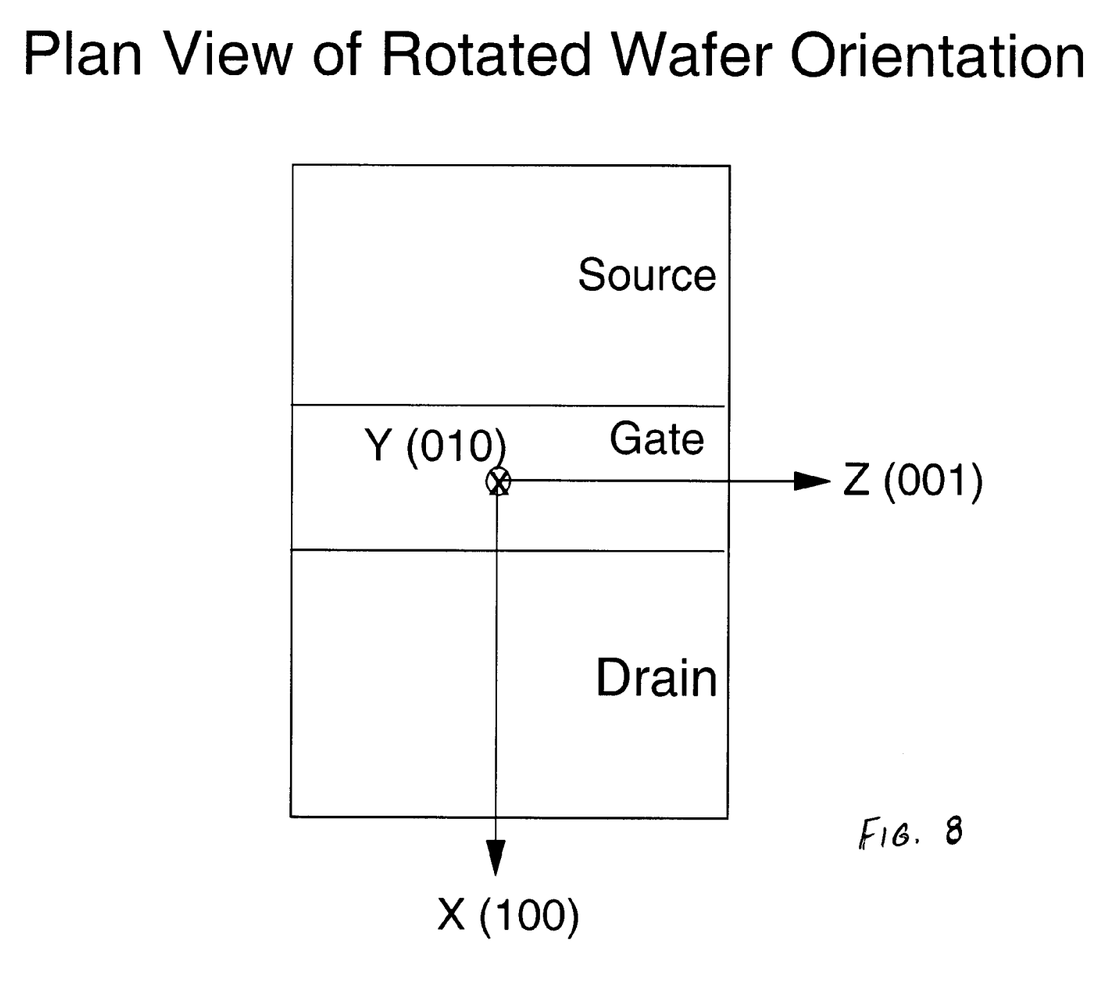
FIG. 8 shows an example of crystal orientations for a rotated substrate.

As shown in FIGS. 4, 5 tensile stress materials substantially fill portions of the STI regions.

Embodiments 1 & 2 Process

See FIGS. 2, 3, 6 and 8.

(1) Using standard processing steps known in the prior art, process the wafer through STI steps with, e.g., a nitride cap (not shown) above the active area still in place.

(2) Strip the nitride cap with the pad oxide (not shown) in place.

(3) Use standard lithographic processes with a block mask and suitably etch the STI regions in the cross-hatched regions R indicated in FIG. 2-3.

(4) Strip the photoresist.

(5) Deposit a highly compressive material (such as a compressive PECVD nitride) into portions of the trenches such that the material substantially fills the portion in the regions R. Preferably, the material extends approximately 10%-30% along one side of each of the source and drain regions as shown in Figures. This step imposes counter-clockwise (negative) shear on the structure, particularly on, e.g., a SOI substrate where the active area (e.g., source, drain, channel) is supported on a BOX region (not shown).

(6) Follow up with standard Chemical Mechanical Polish (CMP) planarization, and follow through with standard processing.

Embodiments 3 & 4 Process

See FIGS. 4, 5, 7 and 8.

(1) Using standard processing known in prior art, process the wafer through STI with, e.g., a nitride cap above the active area still in place.

(2) Strip the nitride cap with the pad oxide still in place.

(3) Use standard lithographic processes with a block mask and etch the STI regions in cross-hatched regions R indicated in FIG. 4-5.

(4) Strip the photoresist.

(5) Deposit highly tensile material (such as a tensile PECVD nitride). This step imposes counter-clockwise (negative) shear on the structure, particularly on, e.g., SOI substrate where the active area is supported on a BOX region (not shown).

(6) Follow up with standard Chemical Mechanical Polish (CMP) planarization and follow through with standard processing.

Preferably, the materials are those with high intrinsic stresses or those which shrink substantially. Preferably, the compressive materials are, e.g., Plasma Enhanced CVD (PECVD) nitride (to create intrinsic stress level of up to about −3 GPa) and compressive HDP oxide (to create intrinsic stress levels of up to about −0.5 GPa). The opening of the portion can also be filled with polysilicon that is oxidized which expands and causes compression to magnitudes of −3 GPa; however, the process complexity makes it a more difficult choice. Preferably, the tensile materials are PECVD nitride (to create intrinsic stress levels of up to about +1.6 GPa), LPTEOS (to create intrinsic stress levels of about +0.5 GPa), spin-on-glass (with processing that is known in prior art to create combined intrinsic and shrinkage stress levels of +2 GPa) or tensile HDP oxide (to create intrinsic stress levels of 0.6 GPa).

Implementing or otherwise realizing the present invention is readily accomplished by those skilled in the art in view of the present specification and figures.

See, for example, U.S. Pat. Nos. 6,828,211 B2; 6,649,486 B1; 6,580,154 B2; 6,794,718 B2; 6,600,170 B1; 6,441,396 B1 and 6,642,536 B1, which are all incorporated herein in their entireties.

Finally, U.S. Pat. No. 6,441,396 B1 teaches a monitor for measuring mechanical stress at the device level in a semiconductor wafer.

While there has been shown and described what is at present considered preferred embodiment of the present invention, those skilled in the art will realize that various changes and modifications may be made therein without departing from the spirit and scope of the invention.

What is claimed is:

1. A semiconductor device structure, comprising:
   a gate structure disposed on a portion of substrate, source and drain regions disposed adjacent to the portion so as to form a channel region in the portion, and trench isolation regions located immediately adjacent to the source and drain regions, wherein at least portions of the trench isolation regions include stress materials such that the materials create torques which generate primary shear stresses in the channel region.

2. The structure as claimed in claim 1, wherein the materials are compressive.

3. The structure as claimed in claim 1, wherein the materials are tensile.

4. The structure as claimed in claim 1, wherein the materials are a compressive nitride.

5. The structure as claimed in claim 1, wherein the materials are a tensile nitride.

6. The structure as claimed in claim 1, wherein the substrate orientation is rotated with X=(100), Y=(010), Z=(001).

7. The structure as claimed in claim 1, wherein the substrate is a SOI substrate.

8. The structure as claimed in claim 2, wherein intrinsic compressive stress of the materials is in the range of approximately −0.5 GPa to approximately −3 GPa.

9. The structure as claimed in claim 3, wherein the material intrinsic tensile stress of the materials is in the range of approximately 0.5 GPa to approximately 2 GPa.

10. The structure as claimed in claim 1, wherein the shear stresses in the channel are in the range of approximately 100 MPa to approximately 700 MPa.

11. The structure as claimed in claim 1, wherein the materials are a compressive HDP oxide.

12. The structure as claimed in claim 1, wherein the materials are a spin-on-glass.

13. The structure as claimed in claim 1, wherein the materials are a tensile HDP oxide.

14. The structure as claimed in claim 1, wherein the substrate orientation is X=(110), Y=(001), Z=(1-10).

15. The structure as claimed in claim 1, wherein the substrate is a bulk substrate.

16. A semiconductor device structure, comprising:
a PFET having source and drain regions, and a channel region therebetween; the structure further comprising trench isolation regions, the source, drain and channel region being disposed between the trench isolation regions, wherein at least portions of the trench isolation regions include stress materials such that the materials create a torque which generates a primary shear stress in the channel region.

17. The structure as claimed in claim 16, wherein the shear stress provides a counter-clockwise torque T.

18. The structure as claimed in claim 16, wherein the materials are a tensile LPTEOS.

* * * * *